(12) United States Patent
Boothby (10) Patent No.: US 12,033,033 B2
(45) Date of Patent: Jul. 9, 2024

(54) INPUT/OUTPUT SYSTEMS AND METHODS FOR SUPERCONDUCTING DEVICES

(71) Applicant: D-WAVE SYSTEMS INC., Burnaby (CA)

(72) Inventor: Kelly T. R. Boothby, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 387 days.

(21) Appl. No.: 17/607,278

(22) PCT Filed: Jun. 11, 2020

(86) PCT No.: PCT/US2020/037222
§ 371 (c)(1),
(2) Date: Oct. 28, 2021

(87) PCT Pub. No.: WO2020/252157
PCT Pub. Date: Dec. 17, 2020

(65) Prior Publication Data
US 2022/0207404 A1    Jun. 30, 2022

Related U.S. Application Data

(60) Provisional application No. 62/860,098, filed on Jun. 11, 2019.

(51) Int. Cl.
G06N 10/40    (2022.01)
H10N 60/12    (2023.01)
H10N 60/80    (2023.01)

(52) U.S. Cl.
CPC ............. *G06N 10/40* (2022.01); *H10N 60/12* (2023.02); *H10N 60/805* (2023.02)

(58) Field of Classification Search
None
See application file for complete search history.

(56) References Cited

U.S. PATENT DOCUMENTS 6,373,294 B1    4/2002    Bentley
6,911,664 B2    6/2005    Il et al.
(Continued)

FOREIGN PATENT DOCUMENTS

KR    101446943 B1    10/2014
WO    2005093649 A1    10/2005
(Continued)

OTHER PUBLICATIONS

Harris et al., "Experimental Demonstration of a Robust and Scalable Flux Qubit," arXiv:0909.4321v1, Sep. 24, 2009, 20 pages.
(Continued)

*Primary Examiner* — Eric Coleman
(74) *Attorney, Agent, or Firm* — Cozen O'Connor (57) ABSTRACT

A quantum processor comprises a plurality of tiles, the plurality of tiles arranged in a first grid, and where a first tile of the plurality of tiles comprises a number of qubits (e.g., superconducting qubits). The quantum processor further comprises a shift register comprising at least one shift register stage communicatively coupled to a frequency-multiplexed resonant (FMR) readout, a qubit readout device, a plurality of digital-to-analog converter (DAC) buffer stages, and a plurality of shift-register-loadable DACs arranged in a second grid. The quantum processor may further include a transmission line comprising at least one transmission line inductance, a superconducting resonator, and a coupling capacitance that communicatively couples the superconducting resonator to the transmission line. A digital processor may program at least one of the plurality of shift-register-loadable DACs. Programming the first tile may be performed in parallel with programming a second tile of the plurality of tiles.

21 Claims, 5 Drawing Sheets

(56) References Cited

U.S. PATENT DOCUMENTS

| | | | |
|---|---|---|---|
| 7,135,701 B2 | 11/2006 | Amin et al. | |
| 7,230,266 B2 | 6/2007 | Hilton et al. | |
| 7,307,275 B2 | 12/2007 | Lidar et al. | |
| 7,418,283 B2 | 8/2008 | Amin | |
| 7,533,068 B2 | 5/2009 | Maassen et al. | |
| 7,619,437 B2 | 11/2009 | Thom et al. | |
| 7,639,035 B2 | 12/2009 | Berkley | |
| 7,843,209 B2 | 11/2010 | Berkley | |
| 7,876,248 B2 | 1/2011 | Berkley et al. | |
| 7,898,282 B2 | 3/2011 | Harris et al. | |
| 7,921,072 B2 | 4/2011 | Bohannon et al. | |
| 7,932,907 B2 | 4/2011 | Nachmanson et al. | |
| 7,984,012 B2 | 7/2011 | Coury et al. | |
| 8,008,942 B2 | 8/2011 | Van et al. | |
| 8,018,244 B2 | 9/2011 | Berkley | |
| 8,035,540 B2 | 10/2011 | Berkley et al. | |
| 8,098,179 B2 | 1/2012 | Bunyk et al. | |
| 8,169,231 B2 | 5/2012 | Berkley | |
| 8,174,305 B2 | 5/2012 | Harris | |
| 8,175,995 B2 | 5/2012 | Amin | |
| 8,190,548 B2 | 5/2012 | Choi | |
| 8,195,596 B2 | 6/2012 | Rose et al. | |
| 8,283,943 B2 | 10/2012 | Van Den Brink et al. | |
| 8,421,053 B2 | 4/2013 | Bunyk et al. | |
| 8,429,108 B2 | 4/2013 | Eusterbrock | |
| 8,560,282 B2 | 10/2013 | Love et al. | |
| 8,854,074 B2 | 10/2014 | Berkley | |
| 8,874,477 B2 | 10/2014 | Hoffberg | |
| 8,972,237 B2 | 3/2015 | Wecker | |
| 9,189,217 B2 | 11/2015 | Von Platen et al. | |
| 9,588,940 B2 | 3/2017 | Hamze et al. | |
| 9,710,758 B2 | 7/2017 | Bunyk et al. | |
| 10,031,887 B2 | 7/2018 | Raymond | |
| 10,650,050 B2 | 5/2020 | He et al. | |
| 10,872,021 B1 | 12/2020 | Tezak et al. | |
| 11,062,227 B2 | 7/2021 | Amin et al. | |
| 11,087,616 B2 | 8/2021 | Rom et al. | |
| 11,422,958 B2 | 8/2022 | Boothby et al. | |
| 2002/0180006 A1 | 12/2002 | Franz et al. | |
| 2002/0188578 A1 | 12/2002 | Amin et al. | |
| 2003/0102470 A1 | 6/2003 | Il et al. | |
| 2003/0169041 A1 | 9/2003 | Coury et al. | |
| 2005/0008050 A1 | 1/2005 | Fischer et al. | |
| 2007/0180586 A1 | 8/2007 | Amin | |
| 2007/0239366 A1 | 10/2007 | Hilton et al. | |
| 2008/0052055 A1 | 2/2008 | Rose et al. | |
| 2009/0078931 A1 | 3/2009 | Berkley | |
| 2009/0192041 A1 | 7/2009 | Johansson et al. | |
| 2009/0259905 A1 | 10/2009 | Silva et al. | |
| 2009/0261319 A1 | 10/2009 | Maekawa et al. | |
| 2009/0289638 A1 | 11/2009 | Farinelli et al. | |
| 2010/0150222 A1 | 6/2010 | Meyers et al. | |
| 2011/0054876 A1 | 3/2011 | Biamonte et al. | |
| 2011/0057169 A1 | 3/2011 | Harris et al. | |
| 2011/0060780 A1* | 3/2011 | Berkley | G06N 10/00 708/620 |
| 2011/0065586 A1 | 3/2011 | Maibaum et al. | |
| 2011/0138344 A1 | 6/2011 | Ahn | |
| 2012/0023053 A1 | 1/2012 | Harris et al. | |
| 2012/0087867 A1 | 4/2012 | McCamey et al. | |
| 2012/0144159 A1 | 6/2012 | Pesetski et al. | |
| 2012/0265718 A1 | 10/2012 | Amin et al. | |
| 2013/0106476 A1 | 5/2013 | Joubert et al. | |
| 2013/0117200 A1 | 5/2013 | Thom | |
| 2013/0267032 A1 | 10/2013 | Tsai et al. | |
| 2013/0278283 A1* | 10/2013 | Berkley | G06N 10/00 326/5 |
| 2014/0229722 A1 | 8/2014 | Harris | |
| 2015/0262073 A1 | 9/2015 | Lanting | |
| 2015/0286748 A1 | 10/2015 | Lilley | |
| 2015/0363708 A1 | 12/2015 | Amin et al. | |
| 2016/0079968 A1 | 3/2016 | Strand et al. | |
| 2016/0233860 A1 | 8/2016 | Naaman | |
| 2016/0238360 A1 | 8/2016 | Naud et al. | |
| 2016/0267032 A1 | 9/2016 | Rigetti et al. | |
| 2016/0364653 A1 | 12/2016 | Chow et al. | |
| 2017/0017894 A1 | 1/2017 | Lanting et al. | |
| 2017/0104695 A1 | 4/2017 | Naaman | |
| 2017/0300454 A1 | 10/2017 | Maassen Van Den Brink et al. | |
| 2017/0351967 A1 | 12/2017 | Babbush et al. | |
| 2017/0364362 A1 | 12/2017 | Lidar et al. | |
| 2018/0101786 A1* | 4/2018 | Boothby | H03M 1/1009 |
| 2018/0123544 A1 | 5/2018 | Abdo | |
| 2019/0019098 A1 | 1/2019 | Przybysz | |
| 2019/0019099 A1* | 1/2019 | Hoskinson | G06F 15/78 |
| 2019/0042677 A1 | 2/2019 | Matsuura et al. | |
| 2019/0042967 A1 | 2/2019 | Yoscovits et al. | |
| 2019/0043919 A1 | 2/2019 | George et al. | |
| 2019/0266508 A1 | 8/2019 | Bunyk et al. | |
| 2019/0378874 A1 | 12/2019 | Rosenblatt et al. | |
| 2019/0391093 A1 | 12/2019 | Achlioptas et al. | |
| 2019/0392352 A1 | 12/2019 | Lampert et al. | |
| 2020/0005155 A1 | 1/2020 | Datta et al. | |
| 2020/0183768 A1 | 6/2020 | Berkley et al. | |
| 2020/0334563 A1 | 10/2020 | Gambetta et al. | |
| 2020/0342345 A1 | 10/2020 | Farhi et al. | |
| 2020/0349326 A1 | 11/2020 | King | |
| 2020/0379768 A1 | 12/2020 | Berkley et al. | |
| 2020/0380396 A1 | 12/2020 | Raymond | |
| 2022/0207404 A1 | 6/2022 | Boothby | |

FOREIGN PATENT DOCUMENTS

| | | |
|---|---|---|
| WO | 2007085074 A1 | 8/2007 |
| WO | 2012064974 A2 | 5/2012 |
| WO | 2014123980 A1 | 8/2014 |
| WO | 2016182608 A2 | 11/2016 |
| WO | 2016183213 A1 | 11/2016 |
| WO | 2017214331 A1 | 12/2017 |
| WO | 2018064535 A1 | 4/2018 |
| WO | 2018111242 A1 | 6/2018 |
| WO | 2019005206 A1 | 1/2019 |
| WO | 2019070935 A2 | 4/2019 |
| WO | 2019168721 A1 | 9/2019 |
| WO | 2020112185 A2 | 6/2020 |
| WO | 2021011412 A1 | 1/2021 |

OTHER PUBLICATIONS

Whiticar, et al., Probing flux and charge noise with macroscopic resonant tunneling, arXiv:2210.01714v1 [quant-ph] Oct. 4, 2022. 11 pages.

Amin, M., "Searching for Quantum Speedup in Quasistatic Quantum Annealers," arXiv:1503.04216v2 [quant-ph] Nov. 19, 2015, 5 pages.

Notice of Allowance for U.S. Appl. No. 17/272,052, mailed Aug. 3, 2023, 10 pages.

Amin et al., "First Order Quantum Phase Transition in Adiabatic Quantum Computation", arXiv:0904.1387v3, Dec. 15, 2009, 5 pages.

Amin et al., Macroscopic Resonant Tunneling in the Presence of Low Frequency Noise, arXiv:0712.0845 [cond-mat.mes-hall], May 13, 2008, pp. 1-4.

Amin, "Effect of Local Minima on Adiabatic Quantum Optimization," Physical Review Letters 100(130503), 2008, 4 pages.

Aspuru-Guzik. "Simulated Quantum Computation of Molecular Energies", Science, Sep. 9, 2005.

Berkley et al., "Tunneling spectroscopy using a probe qubit", arXiv:1210.6310v2 [cond-mat.supr-con] Jan. 3, 2013.

Berkley, A.J. et al., "Tunneling Spectroscopy Using a Probe Qubit," arXiv:1210.6310v2 [cond-mat.supr-con], Jan. 3, 2013, 5 pages.

Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

Byrd. "A Limited-Memory Algorithm For Bound-Contrained Optimization". SIAM Journal on Scientific Computing, Jun. 17, 2005.

Dhande et al. "End-User Calibration for Quantum Annealing". Engineering Project Report—UBC, Jan. 6, 2019.

(56) References Cited

OTHER PUBLICATIONS

D-Wave, "Technical Description of the D-Wave Quantum Processing Unit", D-Wave User Manual 09-1109A-M, Sep. 24, 2018, 56 pages.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Harris et al., "Probing Noise In Flux Qubits via Macroscopic Resonant Tunneling", arXiv:0712.0838v2 [cond-mat.mes-hall], Feb. 8, 2008, pp. 1-4.
International Search Report & Written Opinion for PCT/US2020/041703 mailed Oct. 27, 2020, 9 pages.
International Search Report for PCT/US2019/047747, mailed Jun. 26, 2020, 4 pages.
King et al., "Observation of topological phenomena in a programmable lattice of 1,800 qubits", arXiv:1803.02047 [quant-ph], Mar. 6, 2018, 17 pages.
Lanting et al., "Geometrical dependence of the low-frequency noise in superconducting flux qubits", Physical Review B, 79, 060509, Jun. 5, 2009, 4 pages.
Lanting et al., "Probing High Frequency Noise with Macroscopic Resonant Tunneling", arXiv:1103.1931v1 [cond-mat.supr-con], Mar. 20, 2011, 5 pages.
Lanting, T., "Observation of Co-tunneling in Pairs of Coupled Flux Qubits", arXiv:1006.0028v1 [cond-mat.supr-con], May 31, 2010, 4 pages.
Manucharyan et al., "Fluxonium: single Cooper pair circuit free of charge offsets", arXiv:0906.0831v2, [cond-mat.mes-hall] Oct. 20, 2009, 13 pages.
Nielsen. "The Fermionic canonical commutation relations and the Jordan-Wigner transform", School of Physical Sciences, Jul. 29, 2005.
Petersan et al., "Measurement of resonant frequency and quality factor of microwave resonators: Comparison of methods," Journal of Applied Physics, vol. 84, No. 6, Sep. 15, 1998, 11 pages.
Sete et al., "A Functional Architecture for Scalable Quantum Computing", 2016 IEEE International Conference on Rebooting Computing (ICRC), Oct. 17, 2016, 5 pages.
Swenson et al., "Operation of a titanium nitride superconducting microresonator detector in the nonlinear regime," arXiv:1305.4281v1 [cond-mat.supr-con], May 18, 2013, 11 pages.
Tolpygo et al., "Advanced Fabrication Process for Superconducting Very Large Scale Integrated Circuits", https://arxiv.org/abs/1509.05081, accessed Sep. 16, 2015.
Tolpygo et al., "Advanced Fabrication Processes for Superconducting Very Large Scale Integrated Circuits," IEEE Transactions on Applied Superconductivity 26(3):1-10, Jan. 19, 2016.
Van Harlingen et al., "Decoherence in Josephson-junction qubits due to critical current fluctuations", arXiv:cond-mat/0404307v1 [cond-mat.supr-con], Apr. 13, 2004, 24 pages.
Written Opinion for PCT/US2019/047747, mailed Jun. 26, 2020, 4 pages.
Yohannes et al., "Planarized, Extensible, Multilayer, Fabrication Process for Superconducting Electronics", IEEE Transactions on Applied Superconductivity, vol. 25, No. 3, Jun. 2015.
Extended EP Search Report mailed Jun. 26, 2023, EP App No. 20841331.0-11203—14 pages.
Boothby, K., "Input/Output Systems and Methods for Superconducting Devices," U.S. Appl. No. 62/860,098, filed Jun. 11, 2019, 31 pages.
Boothby, K., et al., "Systems and Methods for Efficient Input and Output to Quantum Processors," U.S. Appl. No. 62/851,377, filed May 22, 2019, 40 pages.
Chen, Y. et al., "Multiplexed Dispersive Readout of Superconducting Phase Qubits," Applied Physics Letters 101 (182601), 2012, 4 pages.
Heinsoo, J. et al., "Rapid high-fidelity multiplexed readout of superconducting qubits," arXiv:1801.07904v1 [quant-ph], Jan. 24, 2018, 13 pages.
International Search Report for PCT/US2020/037222, mailed Sep. 17, 2020, 3 pages.
Michotte, S., "Qubit Dispersive Readout Scheme with a Microstrip Squid Amplifier," arXiv:0812.0220v1 [cond-mat.supr-con], Dec. 1, 2008, 4 pages.
Vollmer, R., "Fast and scalable readout for fault-tolerant quantum computing with superconducting Qubits," Master's Thesis, QuTech, Department of Quantum Nanoscience, Delft University of Technology, Jul. 10, 2018, 80 pages.
Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.
Written Opinion for PCT/US2020/037222, mailed Sep. 17, 2020, 5 pages.

* cited by examiner

INPUT/OUTPUT SYSTEMS AND METHODS FOR SUPERCONDUCTING DEVICES

TECHNICAL FIELD

This disclosure generally relates to input and/or output systems and methods for superconducting devices such as superconducting quantum computers and superconducting classical computers, and, more specifically, to systems and methods for inputting data to a superconducting quantum processor and/or measuring the state of a qubit in the superconducting quantum processor.

BACKGROUND

Frequency Multiplexed Resonant (FMR) Readout

Superconducting microwave resonators have been used in a variety of fields including, but not limited to, quantum computation and astronomy. For example, in quantum computation, superconducting resonators have been used to detect the state of qubits. In astronomy, superconducting microwave resonators have been used in Microwave Kinetic Inductance Detectors (MKIDs). In both cases, many resonators (used as detectors or in detectors) can be coupled to a common transmission line and integrated through frequency domain multiplexing (see Glossary).

Using FMR technology, superconducting resonators of different resonant frequencies can be used for readout of multiple qubits. The resonators can share a common microwave transmission line by using frequency domain multiplexing.

BRIEF SUMMARY

A quantum processor may be summarized as comprising a plurality of tiles, the plurality of tiles arranged in a first grid, a first tile of the plurality of tiles comprising a first qubit, a shift register comprising at least one shift register stage communicatively coupled to a frequency-multiplexed resonant (FMR) readout, a qubit readout device, a plurality of digital-to-analog (DAC) buffer stages, and a plurality of shift-register-loadable digital-to-analog converters (DACs) arranged in a second grid. In some implementations, the first qubit is communicatively coupled to the qubit readout device. In some implementations, at least one of the plurality of DAC buffer stages is communicatively coupled to at least one of the plurality of shift-register-loadable DACs.

In some implementations, the first qubit is a superconducting qubit. In some implementations, the superconducting qubit is a superconducting flux qubit.

In some implementations, the quantum processor further comprises a microwave transmission line, the microwave transmission line communicatively coupled to the FMR readout.

In some implementations, the FMR readout comprises a superconducting resonator.

In some implementations, the first grid and the second grid are interspersed with each other on a superconducting integrated circuit. The term interspersed in the present context refers to a physical intermixing, interweaving, interlacing, braiding, or blending of the first and the second grids (and devices in the grids) with each other on the superconducting integrated circuit.

In some implementations, the FMR readout and the plurality of shift-register-loadable digital-to-analog converters (DACs) are on the same superconducting integrated circuit.

In some implementations, the quantum processor further comprises a transmission line, the transmission line comprising at least one transmission line inductance, a superconducting resonator, and a coupling capacitance that communicatively couples the superconducting resonator to the transmission line.

In some implementations, the FMR readout is communicatively coupled to at least one other element of the quantum processor by a superconducting via. In some implementations, the FMR readout is communicatively coupled to at least one other element of the quantum processor by at least one of a bump bond and/or a solder bond.

A hybrid computing system may be summarized as comprising the quantum processor of various of the above implementations, and further comprising, at least one digital processor, and at least one nontransitory processor-readable medium communicatively coupled to the at least one digital processor, the at least one nontransitory processor-readable medium storing at least one of processor-executable instructions or data which, when executed by the at least one digital processor, cause the at least one digital processor to program the quantum processor.

In some implementations, to cause the at least one digital processor to program the quantum processor the at least one of processor-executable instructions or data, when executed by the at least one digital processor, cause the at least one digital processor to program the first tile of the plurality of tiles. In some implementations, to cause the at least one digital processor to program the first tile of the plurality of tiles the at least one of processor-executable instructions or data, when executed by the at least one digital processor, cause the at least one digital processor to program at least one of the plurality of shift-register-loadable DACs.

In some implementations, to cause the at least one digital processor to program the quantum processor the at least one of processor-executable instructions or data, when executed by the at least one digital processor, further cause the at least one digital processor to program a second tile of the plurality of tiles. In some implementations, to cause the at least one digital processor to program the second tile of the plurality of tiles the at least one of processor-executable instructions or data, when executed by the at least one digital processor, cause the at least one digital processor to program the first and the second tile of the plurality of tiles in parallel. In various of the above implementations, causing the at least one digital processor to program the first and the second tile of the plurality of tiles in parallel may cause a first time taken to program the first tile to be at least approximately the same a second time taken to program the second tile of the plurality of tiles.

In some implementations, the at least one of processor-executable instructions or data, when executed by the at least one digital processor, further cause the hybrid computing system to read out the first qubit of the first tile of the plurality of tiles in parallel with a second qubit of the first tile of the plurality of tiles. In various of the above implementations, the at least one of processor-executable instructions or data, when executed by the at least one digital processor, further cause the hybrid computing system to read out the first qubit of the first tile of the plurality of tiles in parallel with a third qubit of the second tile of the plurality of tiles.

In some implementations, the at least one of processor-executable instructions or data, when executed by the at least one digital processor, further cause the hybrid computing system to read out the first qubit of the first tile of the plurality of tiles and a second qubit of a second tile of the plurality of tiles, wherein a first time taken to read out the first qubit of the first tile of the plurality of tiles is at least approximately the same as a second time taken to read out the second qubit of the second tile of the plurality of tiles.

In various of the above implementations, the at least one of processor-executable instructions or data, when executed by the at least one digital processor, further cause the at least one digital processor to calibrate, in parallel operations, at least a first portion of the quantum processor and a second portion of the quantum processor, the first portion of the quantum processor being non-local to the second portion of the quantum processor.

A quantum computer may be summarized as comprising a first superconducting integrated circuit, the first superconducting integrated circuit comprising a quantum processor, the quantum processor comprising a plurality of superconducting flux qubits, and a second superconducting integrated circuit, the second superconducting integrated circuit comprising an input/output system, wherein the input/output system comprises a shift register comprising at least one shift register stage communicatively coupled to a frequency-multiplexed resonant readout (FMRR) module, a qubit readout device, a plurality of DAC buffer stages, and a plurality of shift-register-loadable digital-to-analog converters (DACs) arranged in a grid.

A method of programming a hybrid computing system, the hybrid computing system comprising a quantum processor and a digital processor, the quantum processor comprising a plurality of tiles, the plurality of tiles arranged in a first grid, a first tile of the plurality of tiles comprising a first qubit, a shift register comprising at least one shift register stage communicatively coupled to a frequency-multiplexed resonant (FMR) readout, a qubit readout device, a plurality of digital-to-analog converter (DAC) buffer stages, and a plurality of shift-register-loadable DACs arranged in a second grid, may be summarized as comprising programming the quantum processor by the digital processor, and reading out the quantum processor by the digital processor.

In some implementations, the programming the quantum processor by the digital processor includes programming the first tile of the plurality of tiles. In some implementations, the programming the first tile of the plurality of tiles includes programming at least one of the plurality of shift-register-loadable DACs.

In some implementations, the programming the quantum processor by the digital processor further includes programming a second tile of the plurality of tiles. In some implementations, the programming the first and the second tile of the plurality of tiles includes programming the first and the second tile of the plurality of tiles in parallel. In various of the above implementations, the programming the first tile of the plurality of tiles has a first duration and the programming the second tile of the plurality of tiles has a second duration, the first duration being at least approximately the same as the second duration.

In some implementations, the reading out the quantum processor by the digital processor includes reading out the first qubit of the first tile of the plurality of tiles in parallel with a second qubit of the first tile of the plurality of tiles. In various of the above implementations, the reading out the quantum processor by the digital processor includes reading out the first qubit of the first tile of the plurality of tiles in parallel with a third qubit of a second tile of the plurality of tiles. In some implementations, the reading out the quantum processor by the digital processor includes reading out the first qubit of the first tile of the plurality of tiles, and reading out a second qubit of a second tile of the plurality of tiles, wherein a first time taken to read out the first qubit of the first tile of the plurality of tiles is at least approximately the same as a second time taken to read out the second qubit of the second tile of the plurality of tiles.

In various of the above implementations, the method further includes calibrating, in parallel operations, at least a first portion of the quantum processor and a second portion of the quantum processor, the first portion of the quantum processor being non-local to the second portion of the quantum processor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn, are not necessarily intended to convey any information regarding the actual shape of the particular elements, and have been solely selected for ease of recognition in the drawings.

DETAILED DESCRIPTION

Glossary

Qubit: A qubit (also referred to in the present application as a quantum bit) is a basic unit of quantum information, and is a quantum version of a classical binary bit that can be physically realized with a two-state device. A qubit is a two-state quantum-mechanical system. A qubit also refers to the actual physical device in which information is stored. For example, superconducting qubits are a type of superconducting device that can be included in a superconducting integrated circuit. Superconducting qubits can, for example, take the form of charge-based or flux-based qubits.

Superconducting device: A superconducting device is an electronic device that makes use of the properties of a superconducting material, for example zero electrical resistance and expulsion of magnetic flux when cooled below a critical temperature characteristic of the superconducting material.

Superconducting circuit: A superconducting circuit is a circuit that includes one or more superconducting devices.

Superconducting microwave resonator (also referred in the present application as a superconducting microresonator): A superconducting microwave resonator is a superconducting circuit that exhibits resonance at microwave frequencies. A superconducting microresonator may be produced by depositing a superconducting thin film on an insulating substrate and applying standard lithographic patterning techniques to produce a resonator structure. A superconducting microresonator may be a lumped-element circuit or a transmission-line resonator. Microresonators can be attractive for detector applications because of their simplicity and because large arrays can be read out using frequency-domain multiplexing (see FMRR below).

Microwave transmission line: A microwave transmission line is a cable or other structure that includes one or more conductors operable to carry alternating electrical current of microwave frequency.

Frequency domain multiplexing (FDM): FDM is a technique in which a communication bandwidth is divided into a number of non-overlapping sub-bands, each sub-band used to carry a separate signal.

Frequency Multiplexed Resonant Readout (FMRR): FMRR is a readout technology that includes a superconducting resonator operable in a frequency domain-multiplexed mode. FMRR technology includes one or more frequency multiplexed resonant (FMR) readouts.

SQUID (Superconducting Quantum Interference Device): A SQUID is a superconducting device that includes a superconducting loop containing one or more Josephson junctions. A SQUID can be used as a magnetometer able to measure very low magnetic fields. A DC SQUID has two Josephson junctions connected in parallel. An RF-SQUID has a superconducting loop containing a single Josephson junction.

Lumped Element Design: In a lumped element design, a spatially distributed physical system is described as a topology of discrete entities that approximate the behavior of the distributed system under certain assumptions. It is useful in electrical and electronic systems, for example.

Shift Register: A shift register is a sequential logic circuit operable to store and/or transfer data.

Quantum Flux Parametron (QFP): A QFP is a logic circuit that includes at least one superconducting Josephson junction and a resonant circuit in which an oscillation can be made to represent a binary digit. Though its design makes use of quantum principles, a QFP is an element of classical computing technology rather than quantum computing technology.

Hybrid Computer: A hybrid computer is a system that includes at least one digital processor, and at least one analog processor (e.g., a quantum processor).

Josephson Junction: A Josephson junction is device that includes two electrodes of material that can superconduct at or below a critical temperature characteristic of the material, and a thin insulating barrier separating the electrodes.

Flux Digital-to-Analog Converter (DAC): A flux DAC is a superconducting device in which magnetic flux quantum representations of digital signals can be established, converted into analog supercurrents, and administered to another device, e.g., a programmable device.

Preamble

In the following description, some specific details are included to provide a thorough understanding of various disclosed implementations and embodiments. One skilled in the relevant art, however, will recognize that implementations or embodiments may be practiced without one or more of these specific details, or with other methods, components, materials, etc. In other instances, well-known structures associated with superconductive circuits or resonators have not been shown or described in detail to avoid unnecessarily obscuring descriptions of the implementations and embodiments of the present methods. Throughout this specification and the appended claims, the words "element" and "elements" are used to encompass, but are not limited to, all such structures, systems, and devices associated with superconductive circuits and resonators.

Unless the context requires otherwise, throughout the specification and claims which follow, the word "comprise" is synonymous with "including," and is inclusive or open-ended (i.e., does not exclude additional, unrecited elements or acts).

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content clearly dictates otherwise. Thus, for example, reference to a readout system including "a superconducting resonator" includes a single superconducting resonator, or two or more superconducting resonators. It should also be noted that the term "or" is generally employed in its sense including "and/or" unless the content clearly dictates otherwise.

The headings provided herein are for convenience only and do not interpret the scope or meaning of the embodiments.

Detailed Description of Technology

In one conventional implementation of a quantum processor, qubits are arranged in one or more tiles, and tiles in the quantum processor are arranged in a grid, for example a square grid of N×N tiles.

In the present application, a tile refers to an array of qubits. In one implementation, a tile includes a number M of horizontally-aligned qubits and an equal number M of vertically-aligned qubits. In another implementation, a tile includes at least one partial qubit (i.e., the tile includes at least one qubit for which a part of the at least one qubit lies outside a boundary of the tile, or for which the at least one qubit is only a partial instantiation of a qubit). A part of a qubit can be a segment of a qubit. A partial instantiation of a qubit can include only some (and not all) segments of a qubit. See the following reference for some examples of quantum processor topologies: International PCT Patent Publication No. WO2017214331A1 entitled SYSTEMS AND METHODS FOR QUANTUM PROCESSOR TOPOLOGY.

In the present application, a horizontally-aligned qubit is a qubit having a larger dimension along a horizontal axis than along a vertical axis, where the vertical axis is perpendicular to the horizontal axis. The horizontal axis can be defined, for example, as an axis parallel to one side of an integrated circuit that includes the quantum processor. In the present application, a vertically-aligned qubit is a qubit having a larger dimension along the vertical axis than the horizontal axis.

In an implementation of a quantum processor, such as the quantum processor described above (having N×N tiles and M×M qubits per tile), a reading out of qubits in the quantum processor can take a readout time proportional to a product NM.

A quantum processor can be programmed using a number of programming lines to the quantum processor. In the present application, programming lines are also referred to as addressing and power lines. See for example, International PCT Patent Application No. US2018/054306 (Publication No. WO2019/070935A2), "QUANTUM FLUX PARAMETRON BASED STRUCTURES (E.G., MUXES, DEMUXES, SHIFT REGISTERS), ADDRESSING LINES AND RELATED METHODS" for a description of addressing and power lines.

A programming system for a quantum processor can include a number of digital-to-analog converters (DACs). In a conventional implementation of a quantum processor, such as the quantum processor described above, the programming system can include approximately $(NM)^2$ DACs.

It is generally desirable to keep the number of programming lines of the quantum processor (also referred to in the present application as the total linecount) as low as practically possible. Typically, there can be at least approximately $$\sqrt[3]{(NM)^2}$$

address and power lines, and programming time can be proportional to $(NM)^{4/3}$.

While the example implementation described above refers to a square grid of tiles, and an equal number of horizontal and vertical qubits in each tile, other implementations of the systems and methods described in the present application can have at least one of a) non-square grids of tiles, and b) tiles with unequal numbers of horizontal and vertical qubits.

Examples of systems of devices implementing shift registers in quantum processors are provided by, for example, U.S. patent application Ser. No. 15/726,239 (also published as US20180101786A1), and International PCT Application Publication No. WO2019/070935A2, both entitled "QUANTUM FLUX PARAMETRON BASED STRUCTURES (E.G. MUXES, DEMUXES, SHIFT REGISTERS), ADDRESSING LINES AND RELATED METHODS."

Some quantum processors address shift-register-controlled DACs using an XYZ scheme in which X and Y signals are denoted as address (ADDR) and trigger (TRIG) lines, respectively, and a Z signal is denoted as a power (PWR) line. The DAC stages in a partition of the quantum processor can be electrically communicatively coupled in series. Powering up the partition, and asserting the ADDR line, and toggling the TRIG line a number of times can write the corresponding number of pulses into a selected DAC.

Approaches useful to operation of scalable processors with ever larger numbers of logic devices (e.g., qubits) can take advantage of QFPs, for example to implement shift registers, multiplexers, de-multiplexers, and permanent magnetic memories, and the like. These approaches can employ XY or XYZ addressing schemes, and can employ control lines that extend in a "braided" pattern across an array of devices. In some implementations, DACs may use kinetic inductance to store energy using thin-film superconducting materials and/or series of Josephson junctions, and may use single-loop or multi-loop designs, and may include meandering structures. DACs can be galvanically and/or inductively communicatively coupled with other devices.

The present application describes systems and methods that include an arrangement of shift registers communicatively coupled to:
a) shift-register-controlled DACs (i.e., DACs that are controlled by one or more shift registers), and
b) qubit readout devices (e.g., qubit readout Quantum Flux Parametrons [QFPs]).

The shift registers can be communicatively coupled to one or more Frequency and Sensitivity Tunable Resonator (FASTR) detectors (also referred to in the present application as FASTRs or FASTR devices). See for example J. D. Whittaker et. al., "A FREQUENCY AND SENSITIVITY TUNABLE MICRORESONATOR ARRAY FOR HIGH-SPEED QUANTUM PROCESSOR READOUT", Journal of Applied Physics 119, 014506 (2016).

One implementation of the systems and methods described in the present application includes a regular grid (e.g., a rectangular grid) of shift-register-controlled DACs, with two axes of readout one axis for readout of horizontal qubits, and another axis for readout of vertical qubits.

Shift registers for routing data to and/or from a FASTR detector can be communicatively coupled in an at least tree-like fashion. A "tree" refers in the present application to a set of nodes connected by a set of edges such that there is a path from any node to any other node, and where there are no cycles of nodes. The term "at least tree-like" refers in the present application to a relaxing of the condition that there are no cycles of nodes. A FASTR detector can be a root of a tree, and shift register stages can be connected as desired. In one implementation, the system can move data from a FASTR detector to a desired shift register stage, and back again.

In another implementation of the systems and methods described in the present application, there are three axes of readout and a hexagonal region of DACs.

In yet another implementation, an I/O region includes only part of a tile. In yet another implementation, an I/O region includes more than one tile. In yet another implementation, an I/O region includes only partial or complete rows of one or more tiles. In yet another implementation, an I/O region includes only partial or complete columns of one or more tiles.

One advantage of the systems and methods described in the present application is a reduction in programming time and/or readout time of a quantum processor. In one implementation, programming time can be proportional to $M^2$, and readout time can be proportional to M. In one implementation, lines to a quantum processor comprising an N×N grid of tiles include N microwave lines. In other implementations, lines to a quantum processor comprising an N×N grid of tiles include more than N microwave lines. In yet other implementations, lines to a quantum processor comprising an N×N grid of tiles include fewer than N microwave lines. Lines to the quantum processor may also include a number of shift register control lines.

In one implementation, the qubits of the quantum processor are placed on one integrated circuit (also referred to in the present application as a chip) and the FMR readouts are placed on a separate chip. An advantage of using a separate chip for the FMR readouts is that it can improve isolation of the qubits of the quantum processor from the microwave FMRR lines. Another advantage is that it can reduce an area needed for layout of the quantum processor. Yet another advantage is that it is possible to test and pre-select FMR readouts in a cryogenic environment before they are integrated with the quantum processor—thereby improving reliability of the system after integration.

In another implementation, the quantum processor may include a conventional readout system comprising peripheral FMRR and/or non-destructive readout (NDRO) modules for input and output. In this implementation, both the FMR readouts and the quantum processors can be tested independently before integration.

In another implementation, FMR readouts are incorporated into the quantum processor, for example in-situ with a tiled arrangement of qubits.

In one implementation, FMR readouts are arranged in a rectangular grid, and the grid is controlled by microwave lines arranged in parallel. See, for example, the implementation of FIG. 1 and the description below.

The rectangular grid of FMR readouts can be communicatively coupled to an integrated input/output network as illustrated, for example, in FIG. 2 and described below with reference to FIG. 2. In this arrangement, input/output (I/O) to each internal tile can be performed independently. The control I/O to each tile, and the lines to control the I/O, can be identical. Input/output to each tile can be performed in parallel to provide tile-wise parallelization of input and/or output operations. In the present context, performing more than one operation (e.g., more than one input/output) in parallel refers to performing more than one operation at the same time or at least partially overlapping in time. An input operation can include programming a device. An output operation can include a readout of a device.

It can be desirable to calibrate one portion of a quantum processor independently from another portion. The term calibration in the present context includes measuring properties of the quantum processor and/or devices in the quantum processor. It can be beneficial for calibration to be able to control the local environment of devices (e.g., qubits) in the quantum processor. The local environment typically refers to a device, its associated DACs, nearest neighboring devices and their associated DACs, and next nearest neighboring devices and their associated DACs.

One approach to calibration is to divide the process of calibration into a set of local measurements that can be performed in parallel with one another. The approach can be applicable to various types of quantum computer including but not limited to adiabatic quantum computers and gate-model quantum computers.

To perform calibration in parallel, it can be advantageous to be able to program the processor, and readout the qubits, in a way that does not add time proportional to the number of devices being measured (otherwise there is little or no advantage over calibrating each local region one at a time). One approach uses a parallel programming scheme that matches the notion of locality (e.g., where each N×M block of devices shares a set of programming lines). In this case, it is possible to parallelize programming of devices that are not local to each other. Readout can be performed by a parallel readout scheme that is able to readout non-local devices in parallel. Programming can be performed by a parallel programming scheme using DACs near devices that are not local to each other.

Controlling the local environment of devices (e.g., qubits) can be parallelizable provided there is a parallel programming interface. Annealing qubits can be parallelizable if the qubits share an analog line and/or if currents on separate analog lines are changeable in parallel. Measuring the state of qubits (also referred to in the present application as a readout of qubits) can be parallelizable using a parallel readout technology (e.g., an FMR readout technology). The systems and methods described in the present application include an FMR readout technology.

In the present context, the term parallelizable refers to an operation where the cost of the performing the operation does not scale in proportion to the number of devices used. In some implementations, it can be advantageous for one aspect of the operation (e.g., the most time-consuming aspect) to be parallelizable even when other aspects are not parallelizable.

Figure 1:
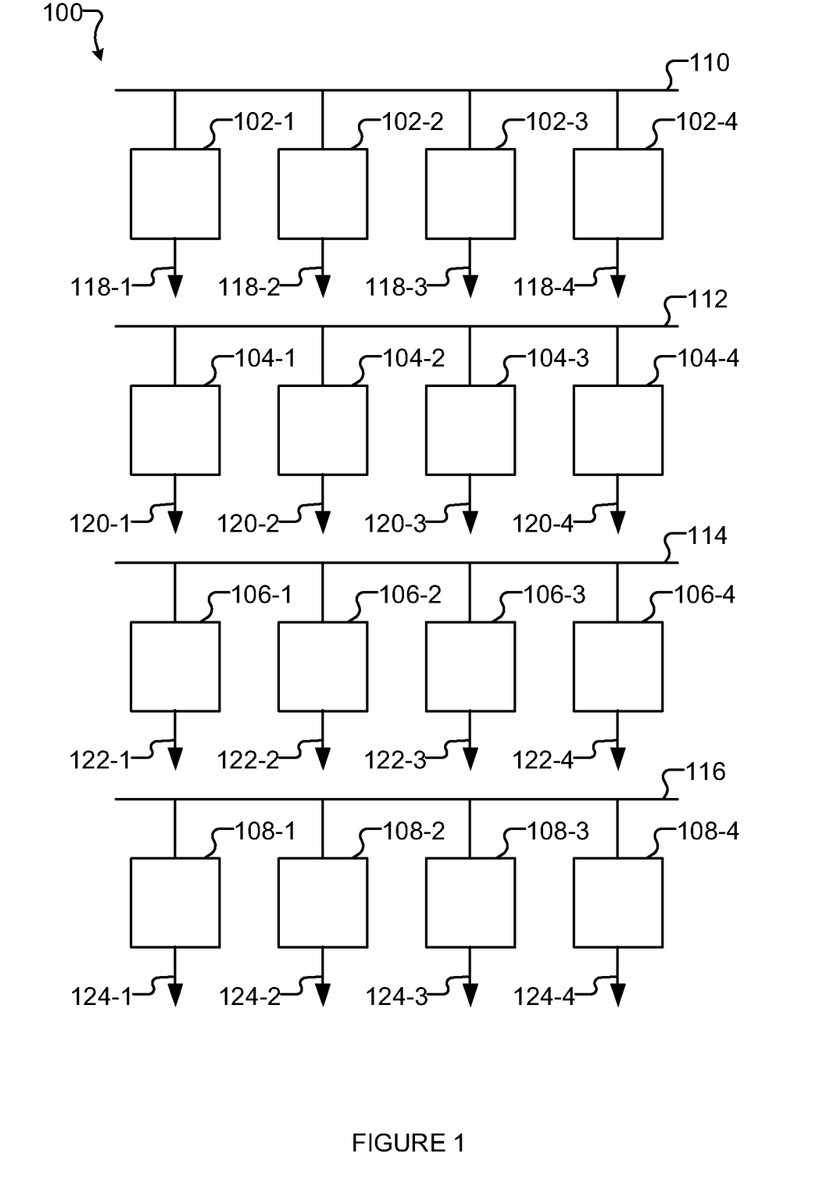
FIG. 1 is a schematic diagram illustrating an example arrangement of FMRR arrays in a superconducting processor.

FIG. 1 is a schematic diagram illustrating an example implementation of a portion 100 of a superconducting processor.

Portion 100 includes an array of FMR readouts 102-1, 102-2, 102-3, and 102-4 (collectively referred to in the present application as FMR readouts 102), 104-1, 104-2, 104-3, and 104-4 (collectively referred to in the present application as FMR readouts 104), 106-1, 106-2, 106-3, and 106-4 (collectively referred to in the present application as FMR readouts 106), and 108-1, 108-2, 108-3, and 108-4 (collectively referred to in the present application as FMR readouts 108). FMR readouts 102 are communicatively coupled to input line 110. FMR readouts 104 are communicatively coupled to input line 112. FMR readouts 106 are communicatively coupled to input line 114. FMR readouts 108 are communicatively coupled to input line 116.

In one implementation, input lines 110, 112, 114, and 116 are separate input lines. In another implementation, some or all of input lines 110, 112, 114, and 116 are communicatively coupled to one another, for example wired together.

FMR readouts 102 are communicatively coupled to other elements of the superconducting processor (not shown in FIG. 1) at 118-1, 118-2, 118-3, and 118-4 respectively. FMR readouts 104 are communicatively coupled to other elements of the superconducting processor at 120-1, 120-2, 120-3, and 120-4 respectively. FMR readouts 106 are communicatively coupled to other elements of the superconducting processor at 122-1, 122-2, 122-3, and 122-4 respectively. FMR readouts 108 are communicatively coupled to other elements of the superconducting processor at 124-1, 124-2, 124-3, and 124-4 respectively.

In one implementation, FMR readouts are communicatively coupled to other elements of the superconducting processor in situ. In another implementation, FMR readouts are communicatively coupled to other elements of the superconducting processor by superconducting vias. In the present application, a via (vertical interconnect access) is an electrical connection between layers in a physical multilayer electronic circuit (e.g., an integrated circuit) that goes through the plane of one or more adjacent layers. In yet another implementation, FMR readouts are communicatively coupled to other elements of the superconducting processor on a separate chip using bump bonds, solder bonds, or another suitable electrical communicative coupling.

Figure 2:
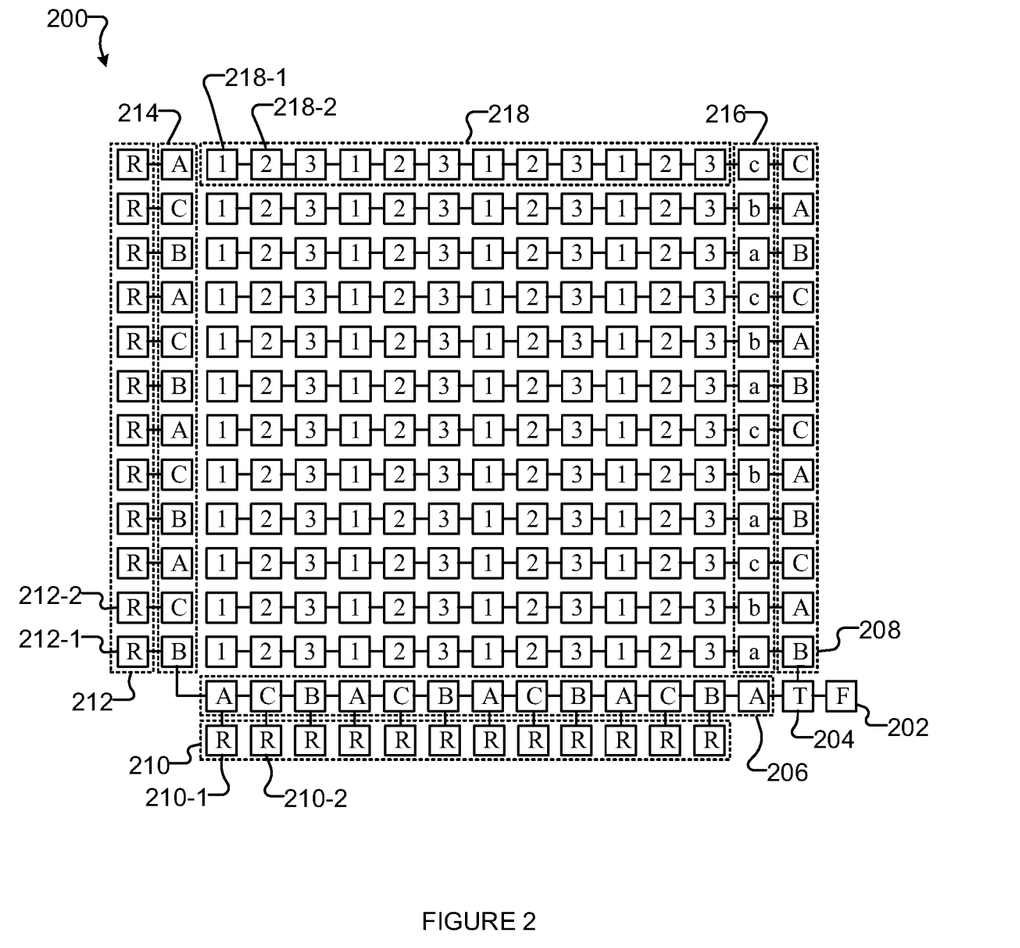
FIG. 2 is a schematic diagram illustrating an example implementation of a superconducting processor that includes shift registers.

FIG. 2 is a schematic diagram illustrating another example implementation of a portion 200 of a superconducting processor. Portion 200 of the superconducting processor includes multiple shift registers.

Portion 200 of the superconducting processor includes a shift register 202 communicatively coupleable to an FMRR module (for example FMRR module 104-1 of FIG. 1). In some implementations, shift register 202 is a single shift register stage. In some implementations, shift register 202 includes more than one shift register stage. Portion 200 of the superconducting processor can be communicatively coupleable to the FMRR module by multiple shift register stages, for example.

Portion 200 of the superconducting processor includes a tee stage 204 that communicatively couples shift register 202 and three-phase inner streets 206 and 208. In the present application, a street is a data path, i.e., a path through the superconducting processor along which data can travel. Data traveling along a street can be input data and/or output data. In one implementation, tee stage 204 is communicatively coupled to an FMRR module (for example FMRR module 104-1 of FIG. 1) by shift register 202. In another implementation, tee stage 204 is communicatively coupled to the FMRR module by shift register 202 where shift register 202 includes multiple shift register stages.

A street can have fewer phases than the three phases illustrated in FIG. 2. A street can have more phases than the three phases illustrated in FIG. 2. In some implementations, streets have four phases.

Portion 200 of the superconducting processor includes qubit readout devices 210-1 and 210-2. Qubit readout devices 210-1 and 210-2 are members of a row of qubit readout devices. The qubit readout devices in the row of qubit readout devices that includes qubit readout devices 210-1 and 210-2 are collectively referred to in the present application as qubit readout devices 210. Each qubit readout of qubit readout devices 210 can include more than one stage. For clarity of illustration, only one stage of each qubit readout of qubit readout devices 210 is illustrated in FIG. 2.

Portion 200 of the superconducting processor includes qubit readout devices 212-1 and 212-2. Qubit readout devices 212-1 and 212-2 are members of a column of qubit readout devices, the qubits in the column of qubits readouts collectively referred to in the present application as qubit readout devices 212. Portion 200 of the superconducting processor includes a three-phase inner street 214 communicatively coupled to qubit readout devices 212.

Portion 200 of the superconducting processor includes DAC buffer stages 216. In some implementations, DAC buffer stages 216 share phases with qubit readout stages, for example qubit readout devices 212.

Portion 200 of the superconducting processor includes shift-register-loadable DACs 218-1 and 218-2. Shift-register-loadable DACs 218-1 and 218-2 are members of a grid of shift-register-loadable DACs. The shift-register-loadable DACs in the grid of shift-register-loadable DACs are collectively referred to in the present application as shift-register-loadable DACs 218. In some implementations, DACs include QFP-DACs.

Portion 200 of the superconducting processor includes three inner streets 206, 208, and 214, as follows: a) horizontal inner street 206 communicatively coupled to qubit readout devices 210 for vertically-aligned qubits, b) vertical inner street 214 communicatively coupled to qubit readout devices 212 for horizontally-aligned qubits, and c) vertical inner street 208 communicably coupled to shift-register-loadable DAC buffer stages 216. In the present application, the term shift-register-loadable DAC buffer stages refers to DAC buffer stages that can be loaded from shift registers. Shift-register-loadable DAC buffer stages 216 are communicatively coupled to shift-register-loadable DACs 218.

In example implementation of FIG. 2, inner streets 206, 208, and are three-phase inner streets, i.e., there are three interleaved families of stages as follows: A-B-C-A-B-C-A-B-C . . . . In some implementations, stages belonging to one family (e.g., the A stages) are controlled by a first global annealing line, stages belonging to another family (e.g., the B stages) are controlled by a second global annealing line, and stages belonging to yet another family (e.g., the C stages) are controlled by a third global annealing line. In practice, there may be one or more global DC bias lines in addition to the global annealing lines.

The purpose of the global annealing lines is to support two operations referred to in the present application as "suppress" and "latch". The suppress operation can set and hold a current in respective shift register stages at zero (or approximately zero, i.e., below a defined threshold). The latch operation can anneal the respective shift register stages. In an implementation where the shift register stages are bistable QFPs, each QFP can have a normalized current of either +1 or −1 at the end of a latch operation, depending on values of local biases experienced by respective shift register stages.

Suppress and latch operations can be performed simultaneously, for example in order to transport data through shift registers.

In an example scenario, the system contains data in the A shift register stages, and each A stage has a flux state of either +1 or −1. For example, the A stages may contain a sequence of data (+1, +1, −1) denoted as follows:

$$A(+1)\text{-}B\text{-}C\text{-}A(+1)\text{-}B\text{-}C\text{-}A(-1)\text{-}B\text{-}C$$

If the B and C stages are suppressed, and their states set to zero, then the sequence is as follows:

$$A(+1)\text{-}B(0)\text{-}C(0)\text{-}A(+1)\text{-}B(0)\text{-}C(O)\text{-}A(-1)\text{-}B(0)\text{-}C(0)$$

If the B stages are annealed while keeping the A stages latched and the C stages suppressed, the most significant signal in their environment can come from adjacent A stages. At the end of the anneal, the B stages contain the opposite of the contents of the adjacent A stages, as follows:

$$A(+1)\text{-}B(-1)\text{-}C(0)\text{-}A(+1)\text{-}B(-1)\text{-}C(0)\text{-}A(-1)\text{-}B(+1)\text{-}C(0)$$

By suppressing the A stages, holding the B stages latched, and annealing the C stages, states can be copied from B to C, as follows:

$$A(0)\text{-}B(-1)\text{-}C(+1)\text{-}A(0)\text{-}B(-1)\text{-}C(+1)\text{-}A(0)\text{-}B(+1)\text{-}C(-1)$$

At this point in the process, the C stages contain the original sequence of data from the A stages, i.e., (+1, +1, −1).

As illustrated by the above example scenario, data can be moved in either direction along a shift register by a suitable sequence of suppress and/or latch operations.

In some implementations, inner streets 206, 208, and 214 include more than three interleaved families of stages.

Other arrangements can be used, for example, some implementations include one or more "crossover" stages. Crossover stages refer to places in the configuration where a phase pattern can be interrupted.

For example, a crossover stage can be a "tee". A tee can be used to turn data around a corner, as follows:

A
B
C-P-Q-R-A-B-C
X
Y
Z
A
B
C

Shift registers (A,B,C) can be operated simultaneously with shift registers (P,Q,R). Shift registers A and P can be driven by the same first signal, B and Q can be driven by the same second signal, and C and R can be driven by the same third signal—while suppressing X throughout. In this way, data can be shifted from the upper (A,B,C), turning the corner via (P,Q,R) to the (A,B,C) on the right of the above illustration.

Subsequently, shift registers (A,B,C) can be operated simultaneously with (X,Y,Z) while suppressing P, so that data can be shifted down from the upper (A,B,C) via (X,Y,Z) to the lower (A,B,C) of the above illustration.

In both cases described above, there is a "controlled" data path, i.e., a data path along which data is being shifted, and an "uncontrolled" data path, i.e., a data path along which the contents of the shift registers are not controlled. The shift registers in the uncontrolled data path can be ignored provided they are isolated from the controlled path by at least one suppressed stage (e.g., X in the first case, and P in the second case).

In the example implementation illustrated in FIG. 2, there are 12 horizontal qubit readout devices, 12 vertical qubit readout devices, and a 12×12 grid of DACs. In other implementations, the processor may have a non-square grid of DACs. In other implementations, the grid dimensions are not the same as the number of qubit readout devices. An example implementation has 12 horizontal qubit readout devices, 12 vertical qubit readout devices, and a 28×14 grid of DACs. In other implementations, other suitable tile dimensions are used. In an example implementation, a shift-register-loadable DAC has six stages.

In the present application, a variable m is used to denote the largest of the number of qubit readout devices, the width of the DAC grid, and the height of the DAC grid. To program a system (for example, a system that includes portion 100 of the superconducting processor of FIG. 1 or portion 200 of the superconducting processor of FIG. 2), a state can first be loaded into a vertical street. In the case of a three-phase street, one-third of a data line can be transferred into the buffer stages at a time.

Each load operation can take of the order of m steps, i.e., each load operation can take O(m) steps, where m is the largest of the total readout size, the DAC grid width, and the DAC grid height. The load operation can be repeated O(m) times to load the DAC stages, and the time taken to program the tile can be $O(m^2)$. Multiple tiles that have the same control structures can be programmed in parallel, and so the total programming time of these tiles can also be $O(m^2)$.

In one implementation, at least a subset of tiles has the same control structures. In some implementations, the control structures can be operated in parallel. In this case, the subset of tiles has at least approximately the same programming time as a single tile. Similarly, for reading out the processor, and because the shift registers have limited length, readout of a processor can take time O(m). Readout of a single qubit can take time O(m). Since multiple qubits in a single tile can be read out in parallel, readout of multiple qubits in a single tile can take time O(m). Furthermore, since qubits in multiple tiles can be read out in parallel, readout of multiple qubits in multiple tiles can also take time O(m).

In some implementations, shift registers can be communicatively coupled between adjacent tiles in the processor grid to improve redundancy, for example to mitigate the risk of having inoperable devices.

Example Readout System

Figure 3:
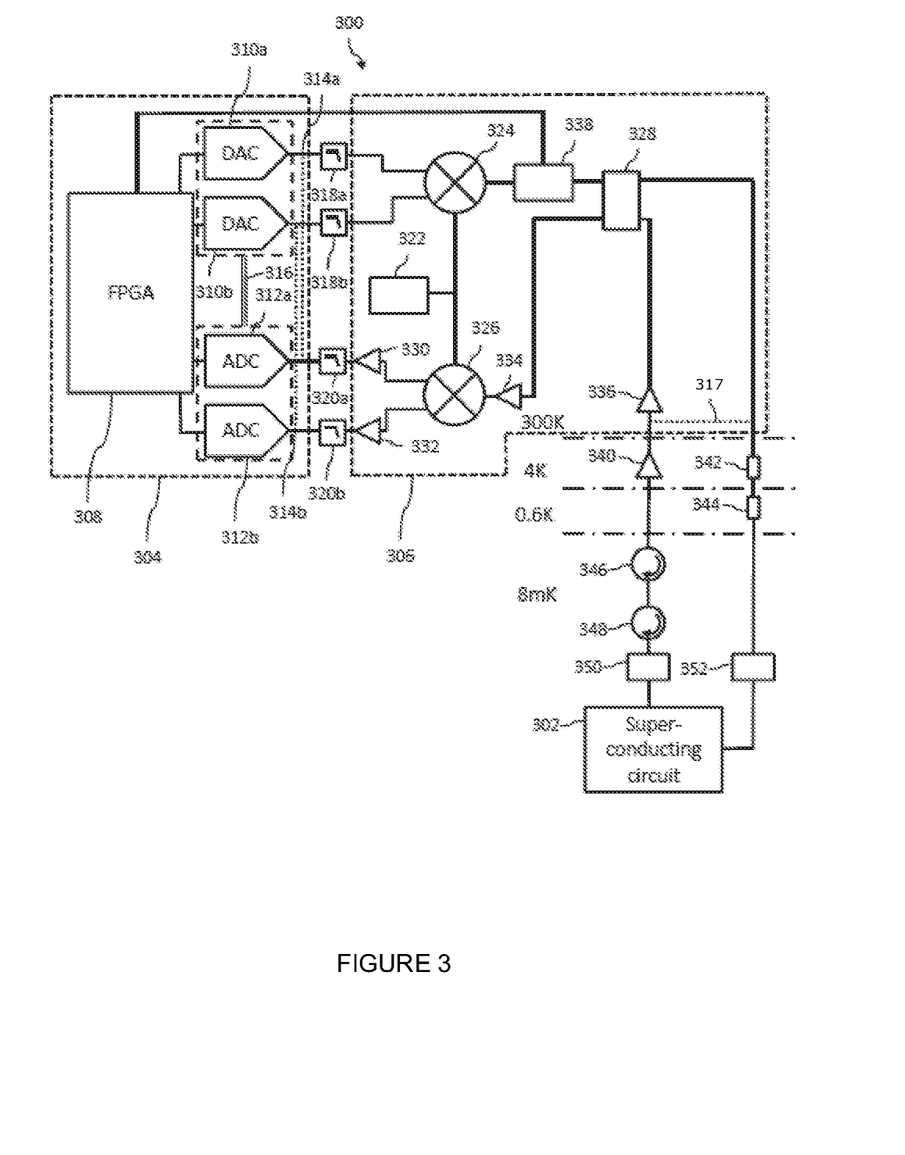
FIG. 3 is a schematic diagram illustrating an example embodiment of a readout system for a superconducting circuit.

FIG. 3 shows a readout system 300 for a superconducting circuit 302, according to at least one exemplary implementation. In the illustrated implementation of FIG. 3, superconducting circuit 302 comprises one or more superconducting resonators. In one implementation, superconducting circuit 302 comprises a superconducting quantum processor.

In another implementation, superconducting circuit 302 comprises a superconducting classical processor. In other implementations, superconducting circuit 302 comprises a superconducting device.

Readout system 300 comprises a digital board 304 and a microwave board 306. Digital board 304 comprises a Field Programmable Gate Array (FPGA) 308, two Digital-to-Analog Converters (DACs) 310a and 310b, and two Analog-to-Digital Converters (ADCs) 312a and 312b. In some implementations, digital board 304 comprises two FPGAs, one providing output to DACs 310a and 310b, and the other providing output to ADCs 312a and 312b. In one implementation, each of DACs 310a and 310b can include a dual-channel 14-bit DAC operating at up to about 5.6 Gsps (Giga samples per second). ADCs 312a and 312b can be implemented using a multi-channel device, for example a quad-channel 10-bit ADC capable of operating in dual-channel mode at up to about 2.5 Gsps.

Readout system 300 advantageously enables independent addressing of two sidebands of a Frequency Multiplexed Readout (FMR) spectrum. The complex received signal can be expressed as follows:

$$x(n)=l(n)+jQ(n)$$

where l(n) is an output of ADC 312a and Q(n) is an output of ADC 312b.

An FMR spectrum can be computed as follows:

$$X_k = \frac{1}{N}\sum_{n=0}^{N-1} x(n)\left[\cos\left(\frac{2\pi kn}{N}\right) - j\sin\left(\frac{2\pi kn + 2\pi k\tau}{N}\right)\right]$$

for k∈0, 1, 2, 3 . . . N−1. The second term in the argument of the sine function in the above expression for the FMR spectrum depends on τ, and can be used to compensate for a phase imbalance between two mixer channels. The phase imbalance can result from the analog nature of the mixer.

Digital board 304 further comprises two loopback lines 314a and 314b, and a sync/clock connection 316a. Loopback line 314a communicatively couples an output of DAC 310a to an input of ADC 312a. Loopback line 314b communicatively couples an output of DAC 310b to an input of ADC 312b.

Microwave board 306 (also referred to in the present application as microwave subsystem 306) further comprises a loopback line 317.

Loopback lines 314a and 314b on digital board 304, and loopback line 317 on microwave board 306 are optional, and can be used to bypass other elements of readout system 300.

Readout system 300 further comprises two reconstruction filters 318a and 318b, and two anti-aliasing filters 320a and 320b. Reconstruction filters 318a and 318b are low-pass analog filters that can be used to produce a band-limited analog signal from a digital input. Anti-aliasing filters 320a and 320b are low-pass analog filters that can be used to band-limit a received signal in order to at least approximately satisfy a sampling theorem over a band of interest.

Microwave board 306 comprises a Voltage-Controlled Oscillator (VCO)/Phase Locked Loop (PLL) 322 which provides a reference microwave signal, mixers 324 and 326, and programmable attenuators 328. Microwave board 306 further comprises amplifiers 330, 332, 334, and 336. Amplifiers 330, 332, 334, and 336 can be used to provide level control on a signal received from superconducting circuit 302. Microwave board 306 further comprises a microwave switch 338 controllable by a signal from FPGA 308 on digital board 304. In one implementation, mixers 324 and 326 are complex mixers.

Readout system 300 further comprises amplifier 340, attenuators 342 and 344, circulators 346 and 348, and DC blocks 350 and 352. DC blocks 350 and 352 can be used as a thermal break on each of the input and output lines to superconducting circuit 302.

In one implementation, amplifier 340 and attenuator 342 can operate at 4 K. Attenuator 344 can operate at 0.6 K. Circulators 346 and 348, and DC blocks 350 and 352, can operate at 8 mK.

In one example implementation, using 60 resonators and a bandwidth of 2.5 GHz, a data rate of approximately 600 Mbps can be achieved for a shift register stage operation time of 25 ns.

A method of operation of readout system 300 of FIG. 3 is described in PCT Patent Application No. WO2016US31885 (published as International patent application publication WO2016183213A1).

A cryogenic subsystem (not shown in FIG. 3) may be used to cool superconducting circuit 302 to temperatures as low as a few mK (milli-Kelvin).

Frequency Multiplexed Readout (FMR) Technology for Superconducting Qubits

Figure 4:
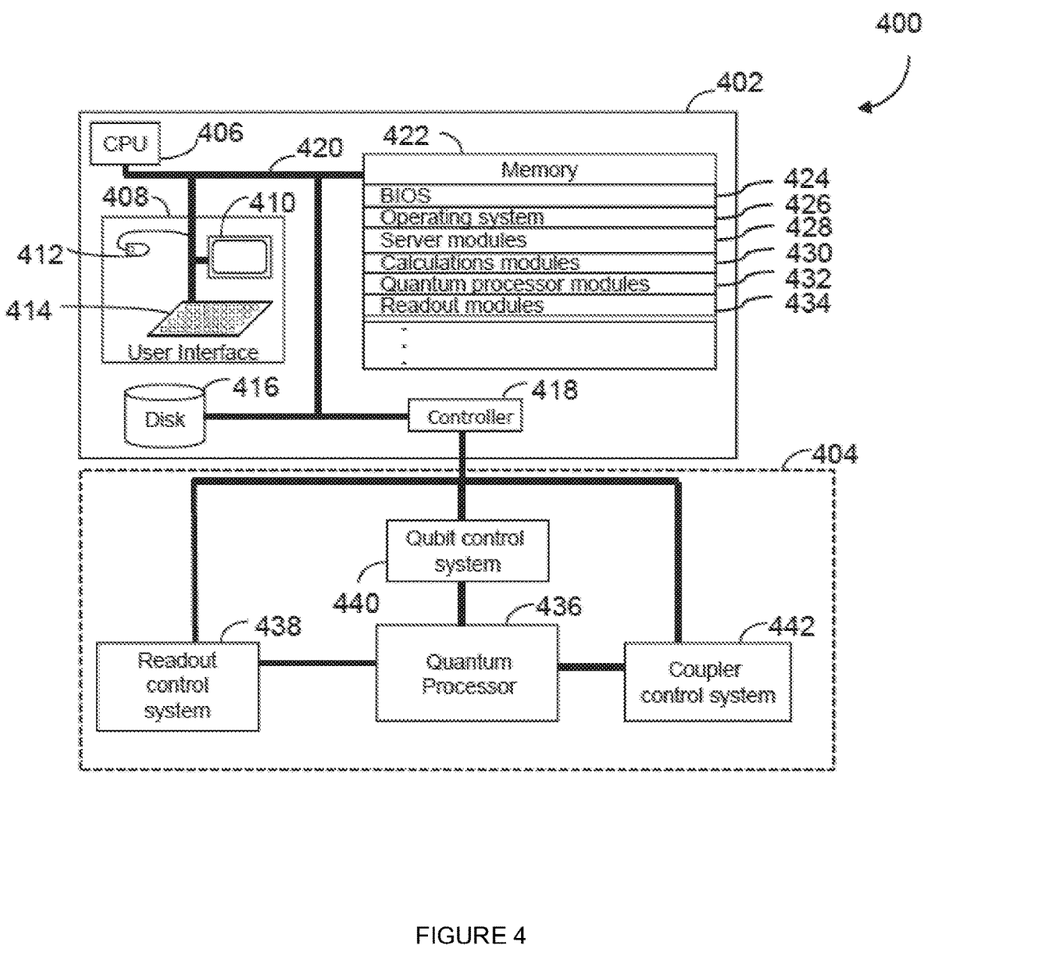
FIG. 4 is a schematic diagram of an exemplary hybrid computing system, including a digital computer and a quantum computer, that may incorporate FMRR technology as described herein.

FIG. 4 shows a hybrid computing system 400 according to at least one exemplary implementation, including a digital computer 402 and a quantum computer 404, that may incorporate FMR technology as described above. Digital computer 402 is also referred to in the present application as a digital processor.

Digital computer 402 comprises CPU 406, user interface elements 408, 410, 412, and 414, disk 416, controller 418, bus 420 and memory 422. Memory 422 comprises BIOS 424, operating system 426, server modules 428, calculations modules 430, quantum processor modules 432, readout modules 434, and other modules that can be used to operate hybrid computing system 400.

Digital computer 402 will at times be referred to in the singular herein, but this is not intended to limit the application to a single digital computer. The present systems and methods can also be practiced in distributed computing environments, where tasks or sets of instructions are performed or executed by remote processing devices, which are linked through a communications network. In a distributed computing environment computer-readable and/or processor-readable instructions (sometimes known as program modules), application programs and/or data, may be stored in local and/or remote memory storage devices (e.g., non-transitory computer-readable and/or processor-readable media).

Quantum computer 404 comprises quantum processor 436, readout control system 438, qubit control system 440 and coupler control system 442. Quantum computer 404 can incorporate FMR technology comprising one or more superconducting resonators. Computing system 400 can comprise a readout system such as readout system 300 of FIG. 3.

Figure 5:
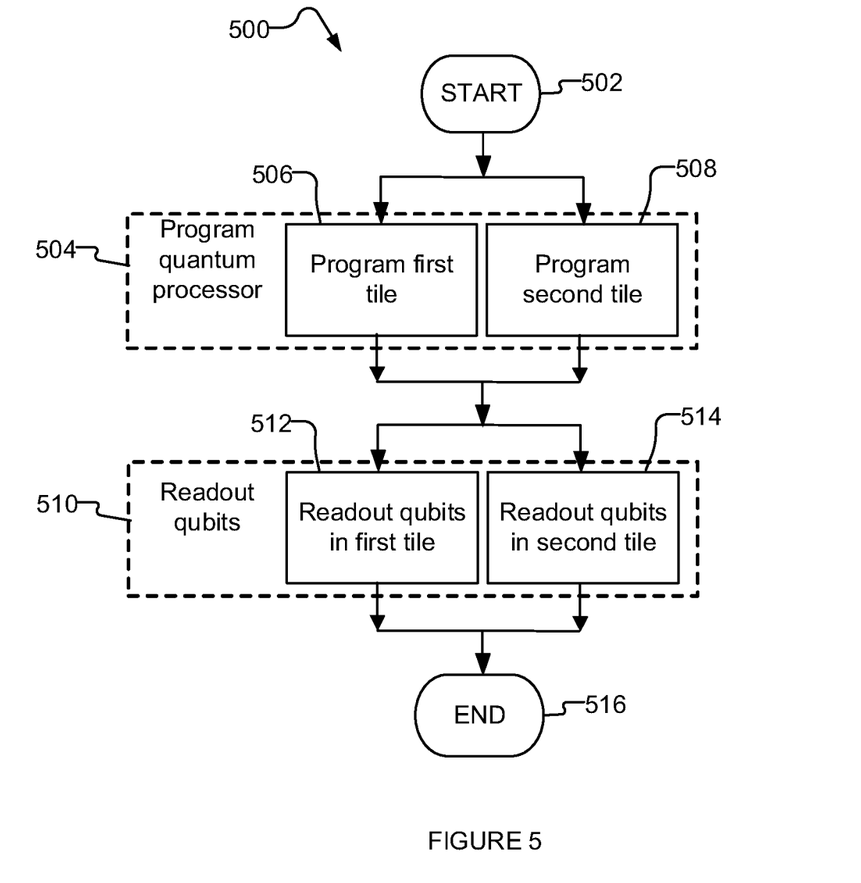
FIG. 5 is a flow diagram of an exemplary method of programming a hybrid computing system, for example the hybrid computing system of FIG. 4.

FIG. 5 is a flow diagram of an exemplary method 500 of programming a hybrid computing system, for example computing system 400 of FIG. 4. Method 500 includes acts 502-516, though those skilled in the art will appreciate that in alternative implementations certain acts may be omitted and/or additional acts may be added. Those skilled in the art will appreciate that the order of the acts is shown for exemplary purposes only and may change in alternative implementations.

At 502, method 500 starts. At 504, a processor-based system, for example a digital processor-based system, programs a quantum processor (for example, quantum processor 436 of FIG. 4). Programming the quantum processor can include programming multiple tiles of the quantum processor in parallel. For example, as shown in FIG. 5, programming the quantum processor can include programming a first tile at 506 in parallel with programming a second tile at 508. The duration of programming the first tile may be at least approximately the same as the duration of programming the second tile. In this context, the term approximately refers to the duration of programming of the first tile being within ten percent of the duration of programming of the second tile. Programming the quantum processor may occur in preparation for a computation by the quantum processor (e.g., a quantum annealing) and/or during a calibration of the quantum processor.

At 510, the processor-based system reads out qubits of the quantum processor, for example via components of a quantum processor-based system. Readout may occur, for example, after a computation by the quantum processor (e.g., after quantum annealing) and/or during a calibration of the quantum processor. Reading out qubits of the quantum processor can include reading out multiple qubits in a single tile in parallel, and/or reading out multiple qubits in multiple tiles in parallel. For example, as shown in FIG. 5, reading out qubits can include reading out qubits in a first tile at 512 in parallel with reading out qubits in a second tile at 514. At 516, method 500 ends.

The duration of reading out qubits in the first tile may be at least approximately the same as the duration of reading out qubits in the second tile. In this context, the term approximately refers to the duration of reading out qubits in the first tile being within ten percent of the duration of reading out qubits in the second tile.

The systems and methods described in the present application can provide a scalable integration of FMRR technology into a fabric of a quantum processor. In conventional applications of FMRR technology, FASTR detectors are typically located at the periphery of the quantum processor. The time required to move data from a quantum device (for example, a qubit) in the processor to a FASTR detector on the periphery of the quantum process can create an inherent readout latency. The latency can be proportional to the number of shift register stages between the quantum device and the FASTR detector. The quantum device having the largest latency sets a lower bound on a readout time for the quantum processor as a whole. When the FMRR technology is located on the periphery of the quantum processor, a dimension (for example, the width) of the quantum processor can establish a lower bound on a readout time of the quantum processor.

The technology described in the present application includes a closer integration of FASTR detectors with quantum devices (for example, qubits) in the quantum processor than conventional configurations.

The present technology includes a construction referred to in the present application as a tile (also referred to in the present application as a unit tile). The tile can have an essentially fixed latency, and an essentially fixed readout time. A grid of tiles can have the same total latency and the same total readout time as an individual tile.

An advantage of the present technology is that the technology provides a scalable readout system. In some implementations, the readout system can scale without incurring runtime costs that scale with the number of devices to be read out. In one implementation, scaling of the readout system is limited by the number of FASTR detectors that can be attached to a single microwave line, and by the number of microwave lines in the readout system.

The systems and methods described in the present application provide integration of FASTR detectors with DACs which can load states from shift-registers. Conventionally, programming a quantum processor can use a large number of analog lines to control a grid of DACs. See, for example, U.S. patent application Ser. No. 15/726,239 (also published as US20180101786A1). In practice, there can be constraints on the number of available analog lines. In one example implementation, 185 analog lines can be used for programming DACs in the quantum processor. Using fewer analog lines can increase programming time.

Scaling conventional technology can be prohibitively complex (for example, if more analog lines have to be added), or prohibitively slow (for example, if scaling increases programming time).

The systems and methods described in the present application can use a reduced number of analog lines to program and control a large-scale processor compared to conventional input/output technology. In one example implementation, 10 to 30 analog lines can be used for programming DACs in the quantum processor. One implementation includes an assembly of tiles, each tile including a respective set of shift registers that can be collectively controlled by a single set of analog lines. Programming time for a tile can be essentially fixed, and programming time for the assembly of tiles can be essentially the same as the programming time of a single tile. Scalability of a system that includes a quantum processor can be determined at least in part by the number of FASTR detectors that can be attached to a single microwave line, and by the number of microwave lines in the system.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to the following: PCT Patent Application No. PCT/US2019/18792, entitled "SYSTEMS AND METHODS FOR COUPLING A SUPERCONDUCTING TRANSMISSION LINE TO AN ARRAY OF RESONATORS", filed Feb. 20, 2018; PCT Patent Application No. PCT/US2016/031885 (published as International patent application publication WO2016183213A1), entitled "FREQUENCY MULTIPLEXED RESONATOR INPUT AND/OR OUTPUT FOR A SUPERCONDUCTING DEVICE," filed May 11, 2016; U.S. Pat. No. 8,854,074, entitled "SYSTEMS AND METHODS FOR SUPERCONDUCTING FLUX QUBIT READOUT," granted Oct. 7, 2014; U.S. Pat. No. 8,169,231, entitled "SYSTEMS, METHODS, AND APPARATUS FOR QUBIT STATE READOUT," granted May 1, 2012; U.S. patent application Ser. No. 15/726,239 (also published as US20180101786A1) filed Oct. 5, 2017, and International PCT Application Publication No. WO2019/070935A2 filed Oct. 4, 2018, both entitled "QUANTUM FLUX PARAMETRON BASED STRUCTURES (E.G. MUXES, DEMUXES, SHIFT REGISTERS), ADDRESSING LINES AND RELATED METHODS", U.S. Provisional Patent Application Ser. No. 62/851,377, entitled "SYSTEMS AND METHODS FOR EFFICIENT INPUT AND OUTPUT TO QUANTUM PROCESSORS" filed May 22, 2019, and U.S. Provisional Patent Application Ser. No. 62/860,098, entitled "INPUT/OUTPUT SYSTEMS AND METHODS FOR SUPERCONDUCTING DEVICES" filed Jun. 11, 2019 all of which are incorporated herein by reference, in their entireties. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum processor comprising a plurality of tiles, the plurality of tiles arranged in a first grid, a first tile of the plurality of tiles comprising:
   a first qubit;
   a shift register comprising at least one shift register stage communicatively coupled to a frequency-multiplexed resonant (FMR) readout;
   a qubit readout device;
   a plurality of digital-to-analog converter (DAC) buffer stages; and
   a plurality of shift-register-loadable DACs arranged in a second grid.

2. The quantum processor of claim 1, wherein the first qubit is communicatively coupled to the qubit readout device.

3. The quantum processor of claim 1, wherein at least one of the plurality of DAC buffer stages is communicatively coupled to at least one of the plurality of shift-register-loadable DACs.

4. The quantum processor of claim 1 wherein the first qubit is a superconducting flux qubit.

5. The quantum processor of claim 1, further comprising a microwave transmission line, the microwave transmission line communicatively coupled to the FMR readout.

6. The quantum processor of claim 1, wherein the FMR readout comprises a superconducting resonator.

7. The quantum processor of claim 1, wherein the first grid and the second grid are interspersed with each other on a superconducting integrated circuit.

8. The quantum processor of claim 1 wherein the FMR readout and the plurality of shift-register-loadable DACs are on the same superconducting integrated circuit.

9. The quantum processor of claim 1, further comprising:
   a transmission line, the transmission line comprising at least one transmission line inductance;
   a superconducting resonator; and
   a coupling capacitance that communicatively couples the superconducting resonator to the transmission line.

10. The quantum processor of claim 1, wherein the FMR readout is communicatively coupled to at least one other element of the quantum processor by at least one of a superconducting via, a bump bond, and a solder bond.

11. A quantum computer comprising:
   a first superconducting integrated circuit, the first superconducting integrated circuit comprising a quantum processor, the quantum processor comprising a plurality of superconducting flux qubits; and
   a second superconducting integrated circuit, the second superconducting integrated circuit comprising an input/output system, wherein the input/output system comprises:

a shift register comprising at least one shift register stage communicatively coupled to a frequency-multiplexed resonant readout (FMRR) module;
a qubit readout device;
a plurality of DAC buffer stages; and
a plurality of shift-register-loadable digital-to-analog converters (DACs) arranged in a grid.

12. A method of programming a hybrid computing system, the hybrid computing system comprising a quantum processor and a digital processor, the quantum processor comprising a plurality of tiles, the plurality of tiles arranged in a first grid, a first tile of the plurality of tiles comprising a first qubit, a shift register comprising at least one shift register stage communicatively coupled to a frequency-multiplexed resonant (FMR) readout, a qubit readout device, a plurality of digital-to-analog converter (DAC) buffer stages, and a plurality of shift-register-loadable DACs arranged in a second grid, the method comprising:
programming the quantum processor by the digital processor, and
reading out the quantum processor by the digital processor.

13. The method of claim 12, wherein the programming the quantum processor by the digital processor includes programming the first tile of the plurality of tiles.

14. The method of claim 13, wherein the programming the first tile of the plurality of tiles includes programming at least one of the plurality of shift-register-loadable DACs.

15. The method of claim 12, the programming the quantum processor by the digital processor further includes programming a second tile of the plurality of tiles.

16. The method of claim 15, wherein the programming the first and the second tile of the plurality of tiles includes programming the first and the second tile of the plurality of tiles in parallel.

17. The method of claim 15, wherein the programming the first tile of the plurality of tiles has a first duration and the programming the second tile of the plurality of tiles has a second duration, the first duration being at least approximately the same as the second duration.

18. The method of claim 12, wherein the reading out the quantum processor by the digital processor includes reading out the first qubit of the first tile of the plurality of tiles in parallel with a second qubit of the first tile of the plurality of tiles.

19. The method of claim 12, wherein the reading out the quantum processor by the digital processor includes reading out the first qubit of the first tile of the plurality of tiles in parallel with a third qubit of a second tile of the plurality of tiles.

20. The method of claim 12, wherein the reading out the quantum processor by the digital processor includes reading out the first qubit of the first tile of the plurality of tiles and reading out a second qubit of a second tile of the plurality of tiles, wherein a first time taken to read out the first qubit of the first tile of the plurality of tiles is at least approximately the same as a second time taken to read out the second qubit of the second tile of the plurality of tiles.

21. The method of claim 12, further comprising calibrating, in parallel operations, at least a first portion of the quantum processor and a second portion of the quantum processor, the first portion of the quantum processor being non-local to the second portion of the quantum processor.

* * * * *